(12) United States Patent
Lu et al.

(10) Patent No.: US 12,308,371 B2
(45) Date of Patent: May 20, 2025

(54) SEMICONDUCTOR DEVICE AND MANUFACTURING METHOD THEREOF

(71) Applicants: TAIWAN SEMICONDUCTOR MANUFACTURING COMPANY, LTD., Hsinchu (TW); National Taiwan University, Taipei (TW)

(72) Inventors: Fang-Liang Lu, Hsinchu (TW); I-Hsieh Wong, Hsinchu (TW); Shih-Ya Lin, Hsinchu (TW); CheeWee Liu, Hsinchu (TW); Samuel C. Pan, Hsinchu (TW)

(73) Assignees: NATIONAL TAIWAN UNIVERSITY, Taipei (TW); TAIWAN SEMICONDUCTOR MANUFACURING COMPANY, LTD., Hsinchu (TW)

( * ) Notice: Subject to any disclaimer, the term of this patent is extended or adjusted under 35 U.S.C. 154(b) by 30 days.

(21) Appl. No.: 18/226,166

(22) Filed: Jul. 25, 2023

(65) Prior Publication Data

US 2023/0369487 A1    Nov. 16, 2023

Related U.S. Application Data

(60) Continuation of application No. 17/373,509, filed on Jul. 12, 2021, now Pat. No. 11,791,410, which is a
(Continued)

(51) Int. Cl.
*H01L 29/78* (2006.01)
*H01L 21/02* (2006.01)
(Continued)

(52) U.S. Cl.
CPC .... *H01L 29/7848* (2013.01); *H01L 21/02381* (2013.01); *H01L 21/0245* (2013.01);
(Continued)

(58) Field of Classification Search
CPC ......... H01L 21/28255; H01L 21/02532; H01L 21/02664; H01L 21/02381; H01L 21/0245;
(Continued)

(56) References Cited

U.S. PATENT DOCUMENTS 6,372,592 B1   4/2002   Russell et al.
8,836,016 B2   9/2014   Wu et al.
(Continued)

FOREIGN PATENT DOCUMENTS

CN   103594419 A   2/2014
CN   103594495 A   2/2014
(Continued)

OTHER PUBLICATIONS

C. Chui et al., "Germanium n-type shallow junction activation dependences" Applied Physics Letters, 2005, vol. 87, 3 pgs.
(Continued)

*Primary Examiner* — Galina G Yushina
(74) *Attorney, Agent, or Firm* — STUDEBAKER BRACKETT PLLC

(57) ABSTRACT

A semiconductor device includes a first layer that includes a first semiconductor material disposed on a semiconductor substrate, and a second layer of a second semiconductor material disposed on the first layer. The semiconductor substrate includes Si. The first semiconductor material and the second semiconductor material are different. The second semiconductor material is formed of an alloy including a first element and Sn. A surface region of an end portion of the second layer at both ends of the second layer has a higher concentration of Sn than an internal region of the end portion of the second layer. The surface region surrounds the internal region.

20 Claims, 13 Drawing Sheets

Related U.S. Application Data continuation of application No. 16/687,055, filed on Nov. 18, 2019, now Pat. No. 11,063,149, which is a division of application No. 15/644,597, filed on Jul. 7, 2017, now Pat. No. 10,510,888.

(60) Provisional application No. 62/427,648, filed on Nov. 29, 2016.

(51) Int. Cl.
| | |
|---|---|
| *H01L 21/268* | (2006.01) |
| *H01L 21/28* | (2006.01) |
| *H01L 21/324* | (2006.01) |
| *H01L 29/06* | (2006.01) |
| *H01L 29/08* | (2006.01) |
| *H01L 29/10* | (2006.01) |
| *H01L 29/161* | (2006.01) |
| *H01L 29/165* | (2006.01) |
| *H01L 29/66* | (2006.01) |

(52) U.S. Cl.
CPC .. *H01L 21/02532* (2013.01); *H01L 21/02535* (2013.01); *H01L 21/02664* (2013.01); *H01L 21/268* (2013.01); *H01L 21/28255* (2013.01); *H01L 21/324* (2013.01); *H01L 29/0847* (2013.01); *H01L 29/1033* (2013.01); *H01L 29/1054* (2013.01); *H01L 29/161* (2013.01); *H01L 29/165* (2013.01); *H01L 29/665* (2013.01); *H01L 29/66651* (2013.01); *H01L 21/02576* (2013.01); *H01L 21/02579* (2013.01); *H01L 29/0649* (2013.01)

(58) Field of Classification Search
CPC ............. H01L 21/02535; H01L 21/268; H01L 21/324; H01L 21/02576; H01L 21/02579; H01L 21/3245; H01L 29/7848; H01L 29/66651; H01L 29/1054; H01L 29/665; H01L 29/0847; H01L 29/1033; H01L 29/161; H01L 29/165; H01L 29/0649; H01L 29/66795

See application file for complete search history.

(56) References Cited

U.S. PATENT DOCUMENTS

| | | | |
|---|---|---|---|
| 8,841,701 B2 | 9/2014 | Lin et al. | |
| 8,847,293 B2 | 9/2014 | Lee et al. | |
| 8,853,025 B2 | 10/2014 | Zhang et al. | |
| 8,962,400 B2 | 2/2015 | Tsai et al. | |
| 9,093,514 B2 | 7/2015 | Tsai et al. | |
| 9,105,475 B1* | 8/2015 | Wang | H01L 21/02631 |
| 9,236,267 B2 | 1/2016 | De et al. | |
| 9,245,805 B2 | 1/2016 | Yeh et al. | |
| 9,520,482 B1 | 12/2016 | Chang et al. | |
| 9,576,814 B2 | 2/2017 | Wu et al. | |
| 2009/0090979 A1 | 4/2009 | Zhu et al. | |
| 2009/0263944 A1* | 10/2009 | Chin | H01L 29/4966 257/E27.108 |
| 2010/0187503 A1 | 7/2010 | Moriyama et al. | |
| 2012/0193711 A1 | 8/2012 | Asano et al. | |
| 2013/0241004 A1* | 9/2013 | Yin | H01L 21/823807 257/E27.061 |
| 2014/0054658 A1* | 2/2014 | Ma | H01L 29/165 438/285 |
| 2015/0182995 A1 | 7/2015 | Theodore et al. | |
| 2015/0263096 A1* | 9/2015 | Yu | H01L 29/165 257/77 |
| 2016/0190286 A1* | 6/2016 | Wang | H01L 21/02505 438/283 |

FOREIGN PATENT DOCUMENTS

| | | |
|---|---|---|
| JP | H02-123730 A | 5/1990 |
| TW | 201543578 A | 11/2015 |

OTHER PUBLICATIONS

L. Wang et al., "Post-growth annealing of gernmanium-tin alloys using pulsed excimer laser", Journal of Applied Physics, 2015, vol. 118, 10 pgs.
S. Gupta et al., "GeSn Channel nMOSFETs: Material Potential and Technological Outlook", 2012 Symposium on VLSI Technology Digest of Technical Papers, 2012, 2 pgs.
D.B. Cuttris, "Relation Between Surface Concentration and Average Conductivity in Diffused Layers in Germanium", The Bell System Technical Journal, Mar. 1961, pp. 509-521.
S.-H. Huang et al., "The $\sim 3 \times 10^{20}$ cm-3 Electron Concentration and Low Specific Contact Resistivity of Phosphorus-Doped Ge on Si by In-Situ Chemical Vapor Deposition Doping and Laser Annealing", IEEE Electron Device Letters, vol. 36, No. 11, Nov. 2015, pp. 1114-1117.
J. Kim et al., "Multiple implantation and multiple annealing of phosphorus doped germanium to achieve n-type activation near the theoretical limit", Applied Physics Letters, vol. 101, 2012, 4 pgs.
M. Posselt et al., "P implantation into preamorpized germanium and subsequent annealing: Solid phase epitaxial regrowth, P diffusion, and activation", Journal of Vacuum Science & Technology, vol. 26, No. 1, pp. 430-434.
M. Finetti et al., "Electrical Properties and Stability of Supersaturated Phosphorus-Doped Silicon Layers", J. Electrochem Soc., 1981, vol. 128, Iss. 6, pp. 1313-1317.
http://refractiveindex.info/?shelf=main&book=Ge&page=Jellison.
Non-final Office Action issued in related U.S. Appl. No. 15/644,597, dated May 23, 2018.
Final Office Action issued in related U.S. Appl. No. 15/644,597, dated Nov. 30, 2018.
Non-final Office Action issued in related U.S. Appl. No. 15/644,597, dated Apr. 10, 2019.
Notice of Allowance issued in related U.S. Appl. No. 15/644,597, dated Aug. 13, 2019.
Notice of Allowance issued in related U.S. Appl. No. 16/687,055, dated Mar. 9, 2021.
Chen et al., "Material characterization of high Sn-content, compressively-strained GeSn epitaxial films after rapid thermal processing," Journal of Crystal Growth, 365 (2013), pp. 29-34 (Year: 2013).
Notice of Allowance issued in related U.S. Appl. No. 17/373,509, dated Jun. 13, 2023.
Final Office Action issued in related U.S. Appl. No. 17/373,509, dated Mar. 31, 2023.
Non-Final Office Action issued in related U.S. Appl. No. 17/373,509, dated Dec. 9, 2022.

* cited by examiner

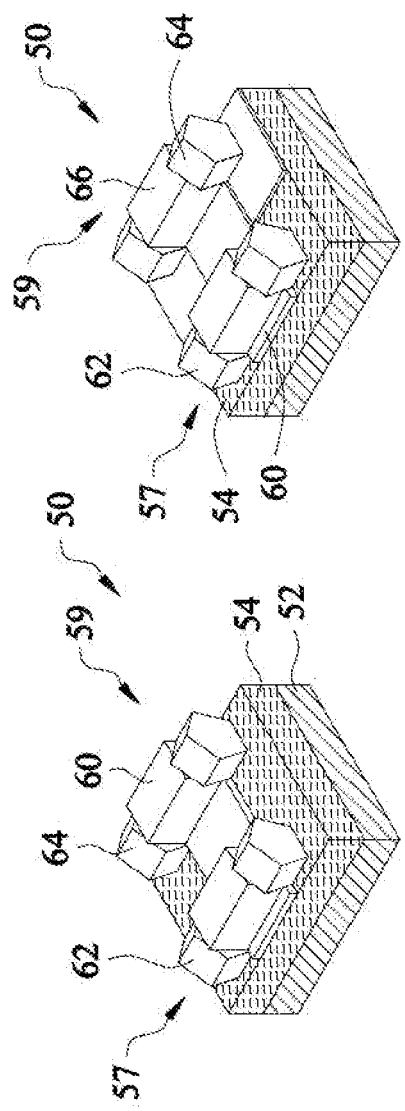
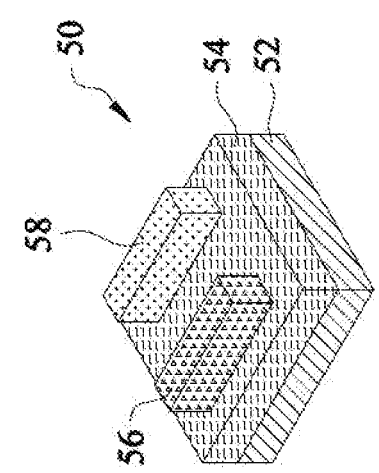
FIG. 20
FIG. 19
FIG. 18

SEMICONDUCTOR DEVICE AND MANUFACTURING METHOD THEREOF

CROSS-REFERENCE TO RELATED APPLICATIONS

This application is a continuation of U.S. patent application Ser. No. 17/373,509 filed on Jul. 12, 2021, now U.S. Pat. No. 11,791,410, which is a continuation of U.S. patent application Ser. No. 16/687,055 filed on Nov. 18, 2019, now U.S. Pat. No. 11,063,149, which is a Divisional of U.S. patent application Ser. No. 15/644,597 filed on Jul. 7, 2017, now U.S. Pat. No. 10,510,888, which claims priority to U.S. Provisional Application No. 62/427,648 filed on Nov. 29, 2016, the entire disclosure of each of the three applications is incorporated herein by reference.

BACKGROUND

As the semiconductor industry has progressed into nanometer technology process nodes in pursuit of higher device density, higher performance, and lower costs, challenges from both fabrication and design issues have resulted in the development of three-dimensional designs, such as a multigate field effect transistor (FET) including a fin FET (FinFET). As devices become smaller and corresponding electrical contact area shrinks, contact resistance increases, and device performance is impacted. It is desirable to reduce contact resistance and improve electron flow in semiconductor devices.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 1 is a cross-sectional view of an exemplary sequential operation in a method of manufacturing a semiconductor device according to an embodiment of the present disclosure.

FIG. 2 is a cross-sectional view of an exemplary sequential operation in a method of manufacturing a semiconductor device according to an embodiment of the present disclosure.

FIG. 3 is a cross-sectional view of an exemplary sequential operation in a method of manufacturing a semiconductor device according to an embodiment of the present disclosure.

FIG. 4 is a cross-sectional view of an exemplary sequential operation in a method of manufacturing a semiconductor device according to an embodiment of the present disclosure.

FIG. 18 is an isometric view of an exemplary sequential operation in a method of manufacturing a complementary metal oxide semiconductor (CMOS) FinFET device according to an embodiment of the present disclosure.

FIG. 19 is an isometric view of an exemplary sequential operation in a method of manufacturing a CMOS FinFET device according to an embodiment of the present disclosure.

FIG. 20 is an isometric view of an exemplary sequential operation in a method of manufacturing a CMOS FinFET device according to an embodiment of the present disclosure.

DETAILED DESCRIPTION

Figure 5:
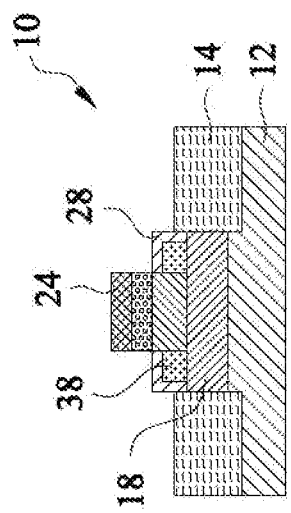
FIG. 5 is a cross-sectional view of an exemplary sequential operation in a method of manufacturing a semiconductor device according to an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

FIGS. 1 to 8 are cross-sectional views of exemplary sequential operations in a method of manufacturing a semiconductor device 10 according to an embodiment of the present disclosure. As shown in FIG. 1, isolation insulating layers 14, such as shallow trench isolation regions, are formed in a semiconductor substrate 12.

In one embodiment, substrate 12 includes a single crystalline semiconductor layer on at least its surface portion. The substrate 12 may comprise a single crystalline semiconductor material such as, but not limited to Si, Ge, SiGe, GaAs, InSb, GaP, GaSb, InAlAs, InGaAs, GaSbP, GaAsSb, and InP. In a certain embodiment, the substrate 12 is made of Si.

The isolation insulating layer 14 includes one or more layers of an insulating material. The insulating material for the insulating layer 14 may include silicon oxide, silicon nitride, silicon oxynitride (SiON), SiOCN, fluorine-doped silicate glass (FSG), or a low-k dielectric material, formed by LPCVD, PECVD or flowable CVD. An anneal operation may be performed after the formation of the isolation insulating layer 14. In some embodiments, the isolation insulating material extends over the uppermost surface of the substrate, and a planarization operation, such as a chemical mechanical polishing (CMP) method and/or an etch-back method, is subsequently performed to remove the upper portion of the isolation insulating layer.

A portion of the semiconductor substrate 12 is removed between adjacent isolation insulating layers 14 to form a recess 16, as shown in FIG. 2. In some embodiments, the removed portion of the semiconductor substrate is removed by suitable photolithographic and etching operations. The depth D1 of the recess from an upper surface of the isolation insulation layer 14 to the upper surface of the recessed substrate 12 is about 1 to about 200 nm in some embodiments.

A first semiconductor layer 18 is formed in the recess 16 and a second semiconductor layer 20 is formed over the first semiconductor layer 18, as shown in FIG. 3. In certain embodiments, the upper surface of the second semiconductor layer 20 extends above the upper surface of the isolation insulating layer 14, as shown in FIG. 4. A gate electrode structure, including a gate dielectric layer 22 and gate electrode layer 24 are subsequently formed over the second semiconductor layer 20.

The first semiconductor layer 18 may include one or more layers of such as, but not limited to, Si, Ge, SiGe, SiGeSn, GeSn, GaAs, InSb, GaP, GaSb, InAlAs, InGaAs, GaSbP, GaAsSb, and InP. In some embodiments, the first semiconductor layer 18 is a buffer layer. Buffer layers are used to transition between the crystal lattice of the semiconductor substrate and the crystal lattice of the second semiconductor layer in some embodiments. The second semiconductor 20 is an alloy semiconductor layer, and may include one or more layers of such as, but not limited to, SiGe, SiGeSn, GeSn, GaAs, InSb, GaP, GaSb, InAlAs, InGaAs, GaSbP, GaAsSb, and InP. In some embodiments, the first semiconductor layer 18 is Ge and the second semiconductor layer 20 is GeSn. The GeSn in the second semiconductor layer 20 is $Ge_{1-x}Sn_x$, where $0.05 \leq x \leq 0.2$, in some embodiments. In certain embodiments, the alloy semiconductor material is selected from the group consisting of $Ge_{0.95}Sn_{0.05}$, $Ge_{0.922}Sn_{0.0728}$, $Ge_{0.90}Sn_{0.10}$, $Ge_{0.95}Sn_{0.05}$, $Ge_{0.83}Sn_{0.17}$, and $Ge_{0.80}Sn_{0.20}$.

In certain embodiments, the first and second semiconductor layers 18, 20 are doped with up to $2 \times 10^{20}$ dopants/cm³. The dopants can be n-type or p-type dopants, including one or more of As, Sb, P, B, Ga, and Al. In some embodiments, in-situ doping is used to incorporate the dopant into the semiconductor region. In other embodiments, ion-implantation, plasma-doping, solid-phase doping, or other doping techniques are used.

In some embodiments, the first semiconductor layers 18 and second semiconductor layers 20 are epitaxially formed over the substrate 12. In some embodiments, the thickness of the first semiconductor layer 18 is about 1 micron or less. In certain embodiments, the first semiconductor layer 18 is not formed. In some embodiments, the thickness of the second semiconductor layer 20 is in a range from about 1 nm to about 200 nm.

The first and second semiconductor layers 18, 20 may be formed by chemical vapor deposition (CVD), including metal-organic CVD (MOCVD), low pressure CVD (LPCVD) and plasma enhanced CVD (PECVD), physical vapor deposition (PVD), molecular beam epitaxy (MBE), atomic layer deposition (ALD), or other suitable processes.

In certain embodiments, the gate dielectric layer 22 includes one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$), other suitable high-k dielectric materials, and/or combinations thereof. In some embodiments, the gate dielectric layer 22 includes an interfacial layer (not shown) formed between the nanowires and the dielectric material. The gate dielectric layer 22 may be formed by CVD, ALD, or other suitable methods. The thickness of the gate dielectric layer 22 is in a range from about 1 nm to about 6 nm in some embodiments.

The gate electrode layer 24 includes one or more layers of a reflective conductive material, such as a metal, including: aluminum, copper, titanium, tantalum, tungsten, cobalt, molybdenum, nickel, alloys thereof, and other suitable materials, and/or combinations thereof. The gate electrode layer 24 may be formed by CVD, ALD, PVD, electroplating, or other suitable methods.

In certain embodiments of the present disclosure, one or more work function adjustment layers (not shown) are interposed between the gate dielectric layer 22 and the gate electrode 24. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. For an nFET, one or more of TaN, TaAlC, TiN, TiC, Co, TiAl, HfTi, TiSi and TaSi is used as the work function adjustment layer, and for a pFET, one or more of TiAlC, Al, TiAl, TaN, TaAlC, TiN, TiC and Co is used as the work function adjustment layer. The work function adjustment layer may be formed by ALD, PVD, CVD, e-beam evaporation, or other suitable process. Further, the work function adjustment layer may be formed separately for the nFET and the pFET, which may use different metal layers.

In some embodiments, the gate electrode structure is formed overlying the channel region of the semiconductor device and source/drain regions are formed on opposing sides of the channel region. Source/drain regions is used in this disclosure to designate source regions, drain regions, or both source and drain regions.

Adverting to FIG. 5, in some embodiments, the semiconductor device 10 is exposed to radiation 26. The exposure to radiation provides ultra-short-time and high-temperature annealing in some embodiments. As shown in FIG. 5, the reflective gate electrode 24 reflects the radiation 26, while the radiation 26 is absorbed by the regions of the semiconductor device 10 not covered by the reflective gate electrode 24. The second semiconductor layer 20 is annealed by the absorbed radiation 26.

In some embodiments, the radiation source is a laser or a flash lamp, including argon and xenon flash lamps. The semiconductor device 10 is exposed to the radiation 26 for a period of time ranging from greater than 0 s to about 100 ms. In particular, each portion of the second semiconductor layer 20 not covered by the reflective gate electrode 24 is exposed to the radiation is exposed for a period of time ranging from greater than 0 s to about 100 ms. In certain embodiments, each portion of the second semiconductor layer 20 exposed to the radiation 26 is exposed for about 1 ns to about 1 ms. In other embodiments, each portion of the second semiconductor layer 20 exposed to the radiation 26 is exposed for about 5 ns to about 100 µs. In other embodiments, each portion of the second semiconductor layer 20 exposed to the radiation 26 is exposed for about 10 ns to about 100 ns. During the exposure to radiation, the exposed portions of the semiconductor device 10 undergo ultra-rapid heating and reach temperatures of up to 2000° C. In other embodiments, the exposed portions of the semiconductor device 10 reach temperatures up to 1100° C.

In some embodiments, the power density of the radiation 26 is about 1 mJ/cm² to about 900 mJ/cm². In certain embodiments, the power density of the radiation 26 ranges from about 250 mJ/cm² to about 300 mJ/cm². In certain embodiments, dynamic surface annealing occurs during the exposure to radiation. In dynamic surface annealing, the activation of the doped regions of the exposed semiconductor layer occurs without diffusion of the dopants.

In some embodiments, the radiation 26 is laser radiation, and the second semiconductor layer 20 undergoes laser annealing as a result of the exposure to the laser radiation 26. In some embodiments, the wavelength used in laser annealing is about 193 nm to about 2296 nm (X=2296 is equivalent to the bandgap of $Ge_{0.90}Sn_{0.10}$). In other embodiments, the wavelength used in laser annealing is about 193 nm to about 1878 nm (=1878 nm is equivalent to the bandgap of Ge). In certain embodiments, a laser beam having a wavelength of about 532 nm is used. In some embodiments, the power density used in laser annealing is about 1 mJ/cm$^2$ to about 900 mJ/cm$^2$. In some embodiments, the full-width-at-half-maximum (FWHM) of the laser pulse is about 1 ns to about 1 ms. A particular spot on the second semiconductor layer is exposed to the laser beam from about 10 ns to about 100 µs in some embodiments. The shape of laser beam can be any shape including linear, elliptical, circular, etc.

For example, in some embodiments a particular spot on the second semiconductor layer is exposed to the laser beam for 15 µs when a laser pulse having a FWHM=12 ns, repetition frequency f=50 kHz, a relative velocity between substrate and the laser beam is 0.6 cm/s, and laser spot size of 150 µm, as shown in the following calculations:

150 µm/0.6 cm/s=0.025 s, 0.025 s×50 kHz=1,250, and 1,250×12 ns=15 µs.

In another embodiment, a particular spot on the second semiconductor layer is exposed to the laser beam for 12 ns when a laser pulse having a FWHM=4 ns, repetition frequency f=1 Hz, a relative velocity between the substrate and the laser beam of 0.1 cm/s, and laser spot size of 3 mm, as shown in the following calculations:

3 mm/0.1 cm/s=3 s, 3 s×1 Hz=3, and 3×4 ns=12 ns.

The laser beam may be scanned across the surface of the semiconductor device 10. In some embodiments, the laser beam is stationary while a stage carrying the semiconductor device moves. The velocity of the stage carrying the semiconductor devices during laser annealing is 0 to about 100 cm/s in some embodiments. In other embodiments, the laser beam is scanned over the surface of the semiconductor device while the stage is stationary. The velocity of the laser beam incident to the semiconductor device during laser annealing is 0 to about 100 cm/s in some embodiments.

In some embodiments, flash annealing is used. In some embodiments, flash annealing is provided by exposing the semiconductor device 10 to radiation from a flash lamp, including an argon flash lamp or a xenon flash lamp. In some embodiments, the semiconductor device 10 is heated to a temperature ranging from about 300° C. to about 600° C. before exposure to the radiation 26. In certain embodiments, the semiconductor device 10 is heated to a temperature ranging from about 400° C. to about 450° C. before exposure to the radiation 26. The semiconductor device 10 is exposed to the flash radiation 26 for a period of time ranging from about 0.1 ms to about 100 ms. In certain embodiments, the semiconductor device 10 is exposed to flash radiation 26 for about 0.5 ms to about 1.5 ms. During the exposure to radiation, the exposed portions of the semiconductor device 10 undergo ultra-rapid heating and reach temperatures of up to 2000° C. In other embodiments, the exposed portions of the semiconductor device 10 reach temperatures ranging from about 800° C. to about 1100° C. during flash annealing. In some embodiments, the power density of the radiation 26 is about 1 mJ/cm$^2$ to about 900 mJ/cm$^2$. In certain embodiments, the power density of the radiation 26 ranges from about 250 mJ/cm$^2$ to about 300 mJ/cm$^2$.

Figure 6:
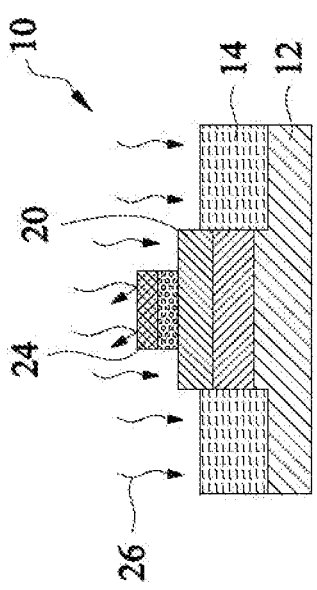
FIG. 6 is a cross-sectional view of an exemplary sequential operation in a method of manufacturing a semiconductor device according to an embodiment of the present disclosure.

The annealing operation transforms the second semiconductor layer 20 so that a surface region 28 of the unmasked portion of the second semiconductor layer has a higher concentration of a second alloy element of the alloy material of the second semiconductor layer than an internal region of the unmasked portion of the second semiconductor layer 38. As shown in FIG. 6, the surface region 28 of the unmasked portion of the second semiconductor layer surrounds the internal region 38 of the unmasked portion of the second semiconductor layer. In some embodiments, the radiation annealing causes the second alloy element of the semiconductor alloy to migrate to the surface region of the second semiconductor layer and form islands of higher concentration second alloy element on the surface of the second semiconductor alloy. The surface region 28 with a higher concentration islands/layer of the second element of the alloy material may have improved contact resistivity.

When the second semiconductor layer 20 is GeSn, the channel region under the gate electrode structure is represented as Ge$_{1-y}$Sn$_y$, the Sn-rich surface region 28 is represented as Ge$_{1-w}$Sn$_w$, and the interior portion with reduced Sn content is represented as Ge$_{1-x}$Sn$_x$, where x<y<w. When x<y, the internal region 38 induces tensile strain in the channel region, thereby improving electron mobility in the channel region of n-type FETs.

The thickness of the surface region 28 of the second semiconductor layer is about 1 to about 20 nm in some embodiments.

In certain embodiments, the annealing operation transforms GeSn source/drain regions into a GeSn region with a reduced Sn content and a GeSn nFET stressor. Further, using selective laser annealing according to embodiments of the present disclosure, allows a higher dopant concentration of n-type dopant, such as >3×10$^{19}$ cm$^{-3}$, to be achieved in the GeSn source/drain regions. Because of the nanosecond-scale annealing duration, laser annealing causes the semiconductor layer to become supersaturated in certain embodiments (i.e.—the solute is the dopant and the solvent is the semiconductor material). The semiconductor layer becomes metastable and the dopant concentration increases. In addition, laser annealing effectively activates dopants in the source/drain regions in some embodiments.

Figure 7:
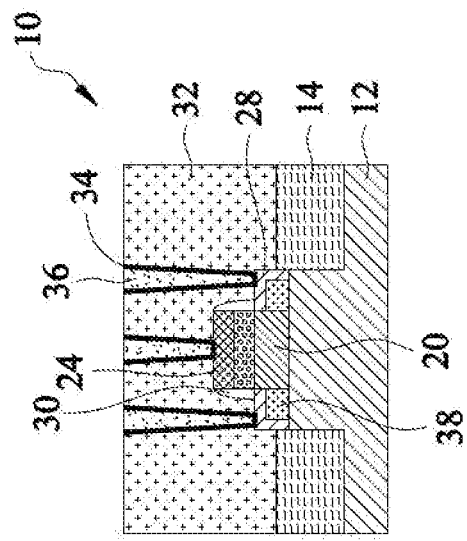
FIG. 7 is a cross-sectional view of an exemplary sequential operation in a method of manufacturing a semiconductor device according to an embodiment of the present disclosure.

Adverting to FIG. 7, in some embodiments of the disclosure, insulating sidewalls 30 are formed on lateral surfaces of the gate electrode structure, and an interlayer dielectric 32 is formed overlying the semiconductor device 10. The interlayer dielectric is a spin on glass (SOG), including phosphosilicate glass (PSG) or borophosphosilicate glass (BPSG), in some embodiments. The insulating sidewalls 30 may be formed of an oxide, such as silicon oxide, and/or a nitride, such as silicon nitride. The thickness of the insulating sidewalls 30 is 10 nm to about 200 nm in some embodiments. Vias are subsequently formed in the interlayer dielectric 32, such as by using suitable photolithographic, etching, and material deposition techniques, and electrical contacts 36 are formed in the vias providing electric contact to the source/drain stressors 28 and gate electrode layer 24. In some embodiments, a contact barrier liner layer 34 is formed in the via prior to forming the contact 36. In some embodiments, the contact barrier liner layer 34 is formed of a metal nitride, such as TaN or TiN. The contact barrier liner layer may be formed by ALD, PVD, CVD, or other suitable process. In some embodiments, the contact 36 is formed of aluminum, copper, titanium, tantalum, tungsten, cobalt, molybdenum, nickel, alloys thereof, and other suitable conductive materials. The contact 36 may be formed by CVD, ALD, electroplating, or other suitable methods.

Figure 8:
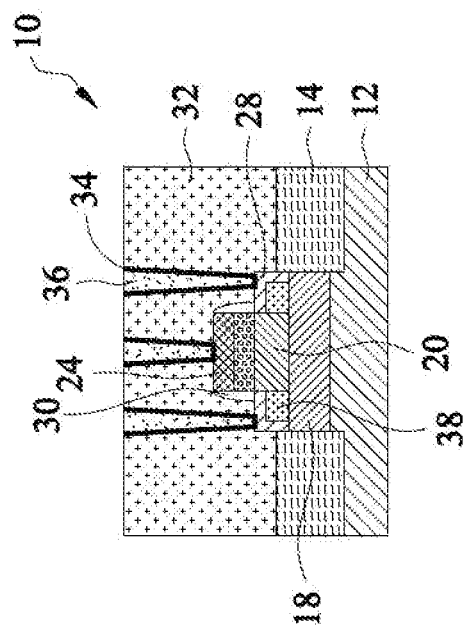
FIG. 8 is a cross-sectional view of an exemplary sequential operation in a method of manufacturing a semiconductor device according to an embodiment of the present disclosure.

In some embodiments, the first semiconductor layer 18 is a buffer layer. In certain embodiments, a Si$_a$Ge$_b$Sn$_{1-a-b}$ single layer, multiple layer, or graded buffer layer 18 is formed on the substrate 12 having a thickness of about 0 to about 10 µm. In certain embodiments, no buffer layer is included. Rather, only one semiconductor layer 20 including an alloy semiconductor material is formed on the substrate 12 as shown in FIG. 8. In some embodiments, such as when a Ge substrate is used, a buffer layer is not used. The operations for forming the embodiment of FIG. 8, are the same as those described with respect to FIGS. 4-7.

Figure 10:
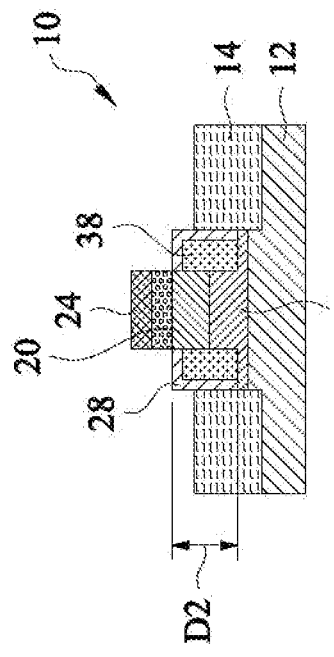
FIG. 10 is a cross-sectional view of an exemplary sequential operation in a method of manufacturing a semiconductor device according to an embodiment of the present disclosure.
Figure 11:
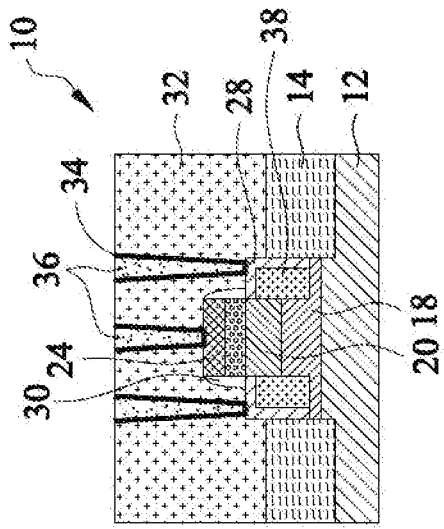
FIG. 11 is a cross-sectional view of an exemplary sequential operation in a method of manufacturing a semiconductor device according to an embodiment of the present disclosure.
Figure 9:
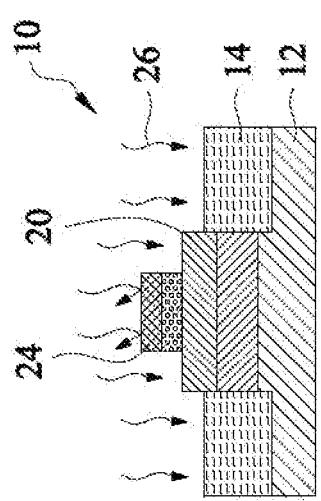
FIG. 9 is a cross-sectional view of an exemplary sequential operation in a method of manufacturing a semiconductor device according to an embodiment of the present disclosure.

FIGS. 9-11 are cross-sectional views of exemplary sequential operations in a method of manufacturing a semiconductor device 10 according to another embodiment of the present disclosure. As shown in FIG. 9, a semiconductor device 10 having a gate electrode structure formed over a semiconductor layer 20 is exposed to radiation 26, such as laser radiation. The semiconductor device 10 is exposed to radiation 26 for a longer period of time than the embodiments described in FIGS. 1-8. In some embodiments, each portion of the second semiconductor layer 20 not covered by the reflective gate electrode 24 is exposed to the radiation for a period of time ranging from about 1 s to about 100 s. In certain embodiments, each portion of the second semiconductor layer 20 not covered by the reflective gate electrode 24 is exposed to the radiation 26 for a period of time ranging from about 5 s to about 50 s. The exposure radiation transforms the first semiconductor layer 18 and the second semiconductor layer 20 so that a surface region 28 of a portion of the first and second semiconductor layers 18, 20 not masked by the gate electrode 24 has a higher concentration of the second element than an internal region 38 of a portion of the first and second semiconductor layers 18, 20 not masked by the gate electrode 24 in some embodiments. In some embodiments, the longer duration of exposure to radiation 26 causes the surface region 28 of the unmasked portion of the second semiconductor layer having a higher concentration of a second element of the alloy material of the second semiconductor layer and the internal region of the unmasked portion of the second semiconductor layer 38 with a lower concentration of the second alloy material to extend a depth D2 into the first semiconductor layer 18, as shown in FIG. 10. In this embodiment, the second element of alloy semiconductor layer 20 diffuses into the first semiconductor layer 18, during the annealing operation. For example, when the first semiconductor layer 18 is a Ge layer and the second semiconductor layer 20 is a GeSn layer, in addition to the Sn migrating to the surface of the GeSn layer, Sn also migrates into the Ge layer, thereby extending the GeSn layer into the Ge layer. As depicted in FIG. 11, an interlayer dielectric 32, and liner layer 34 and contacts 36 in the interlayer dielectric are subsequently formed, as described herein with respect to FIG. 7.

Figure 12:
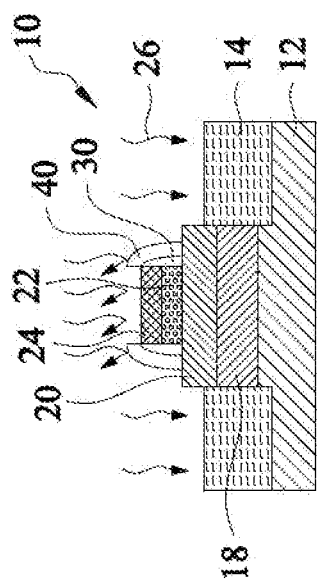
FIG. 12 is a cross-sectional view of an exemplary sequential operation in a method of manufacturing a semiconductor device according to an embodiment of the present disclosure.
Figure 14:
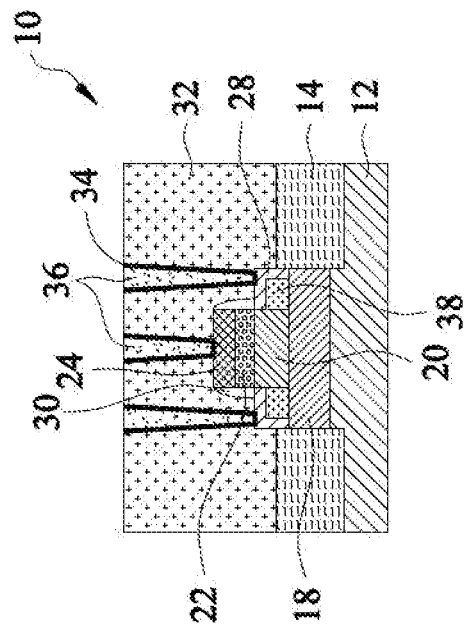
FIG. 14 is a cross-sectional view of an exemplary sequential operation in a method of manufacturing a semiconductor device according to an embodiment of the present disclosure.
Figure 13:
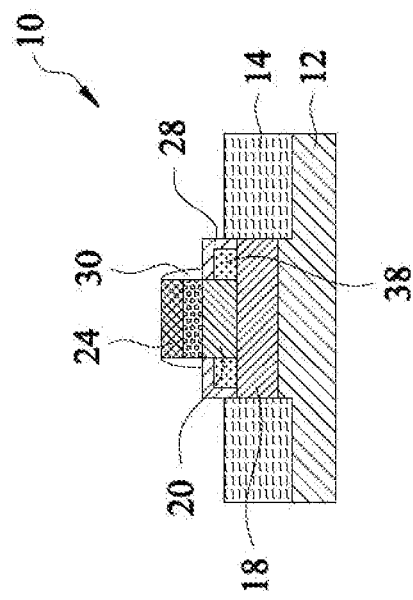
FIG. 13 is a cross-sectional view of an exemplary sequential operation in a method of manufacturing a semiconductor device according to an embodiment of the present disclosure.

FIGS. 12-14 are cross-sectional views of exemplary sequential operations in a method of manufacturing a semiconductor device 10 according to another embodiment of the present disclosure. As shown in FIG. 12, an insulating sidewall 30 is formed on sidewalls of the gate structure, and a reflective metal sidewall spacer 40 is formed over the insulating sidewall 30. After forming the pair of sidewalls 30, 40, the semiconductor device is exposed to radiation 26 to anneal the second semiconductor layer 20 to form surface portions 28 having a higher concentration of the second element of the alloy semiconductor material than the interior portion 38 of the second semiconductor layer, as shown in FIG. 13. The reflective metal sidewall spacer 40 reduces the portion of the second semiconductor layer 20 that is exposed to radiation and thus reduces the size of the surface portion 28 and interior portion 38, thereby reducing the size of the source/drain regions relative to the channel region. As depicted in FIG. 14, an interlayer dielectric 32, and liner layer 34 and contacts 36 in the interlayer dielectric are subsequently formed, as described herein with respect to FIG. 7.

The reflective metal sidewall spacers 40 can be used to reduce the size of the source/drain regions and extend the channel region, or to prevent heating of the channel region during the irradiation operation. The reflective metal sidewall spacers 40 may be formed of any of the metals disclosed herein for use in the gate electrode layer 24, including aluminum, copper, tantalum, tungsten, cobalt, molybdenum, nickel, and alloys thereof.

Figure 15:
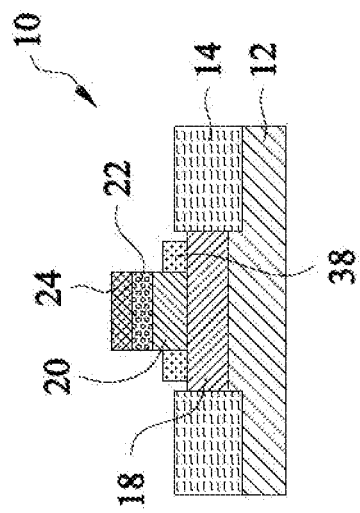
FIG. 15 is a cross-sectional view of an exemplary sequential operation in a method of manufacturing a semiconductor device according to an embodiment of the present disclosure.
Figure 17:
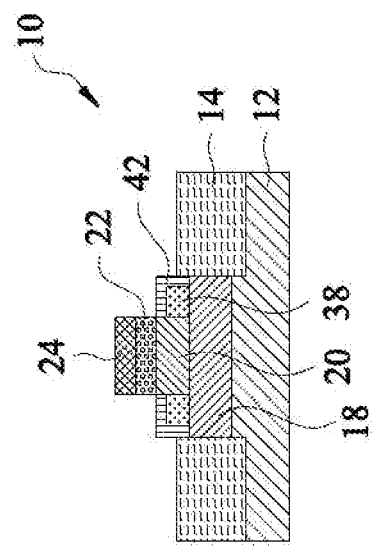
FIG. 17 is a cross-sectional view of an exemplary sequential operation in a method of manufacturing a semiconductor device according to an embodiment of the present disclosure.
Figure 16:
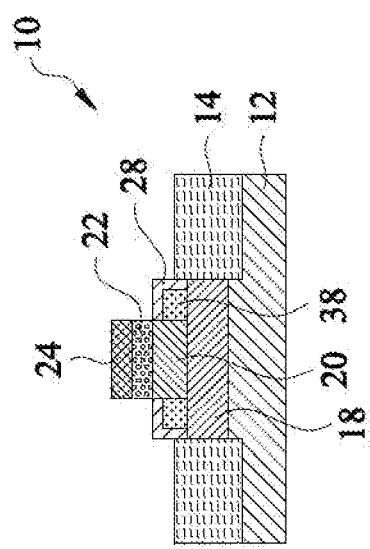
FIG. 16 is a cross-sectional view of an exemplary sequential operation in a method of manufacturing a semiconductor device according to an embodiment of the present disclosure.

FIGS. 15-17 are cross-sectional views of exemplary sequential operations in a method of manufacturing a semiconductor device 10 according to another embodiment of the present disclosure. Adverting to FIG. 15, a surface portion 28 of the second semiconductor layer having a higher concentration of a second element of the alloy material of the second semiconductor layer than an interior portion of the second semiconductor layer 38, is formed in the same manner as the embodiment described in FIGS. 3-6.

The surface portion 28 is subsequently removed exposing interior portion 38, as shown in FIG. 16. The surface portion 28 is removed by etching using an appropriate etchant that is selective to the surface portion having the higher concentration of the second element of the alloy material than the interior portion. In certain embodiments, the etchant is 5%-37% HCl or 10%-30% $H_2O_2$.

A metal contact layer 42 is subsequently formed over the interior portion 38 of the second semiconductor layer, as shown in FIG. 17. In some embodiments, the metal contact layer 42 includes Ni, Ti, Pt, Co or any alloy of these four elements. The metal contact layer 42 is formed by CVD, ALD, electroplating, or other suitable methods. In some embodiments, the portion of the metal contact layer 42 contacting the interior portion 38 of the second semiconductor layer may react or form an alloy with the interior portion 38 second semiconductor layer at the interface between the metal contact layer 42 and the interior portion 38 of the second semiconductor layer.

FIGS. 18-22 are isometric views of exemplary sequential operations in a method of manufacturing a complementary metal oxide semiconductor (CMOS) FinFET device 50 according to another embodiment of the present disclosure. As shown in FIG. 18, an n-type fin structure 56 and p-type fin structure 58 are formed on a semiconductor substrate 52 by operations similar to those described herein with respect to FIGS. 1-3. An isolation insulating layer 54 is formed on the semiconductor substrate 52 surrounding the fin structures 56, 58.

A gate stack 60 including a gate dielectric layer and gate electrode layer are formed overlying a channel region of the fin structures 56, 58. Source/drain regions 62, 64 are epitaxially formed on the fin structures 56, 58 on opposing sides of the gate structure 60, in some embodiments forming an n-type FET (nFET) 57 and a p-type FET (pFET) 59, as shown in FIG. 19. The source/drain regions 62, 64 are epitaxially formed alloy semiconductors, and may include one or more layers of such as, but not limited to, SiGe, SiGeSn, GeSn, GaAs, InSb, GaP, GaSb, InAlAs, InGaAs, GaSbP, GaAsSb, and InP. The nFET source/drain regions 62 are doped with an n-type dopant, such as As, P, or Sb, and the pFET source/drain regions 64 are doped with p-type dopants, such as B, Al, and Ga.

A mask 66 is subsequently formed over the pFET 59, as shown in FIG. 19. The mask is a reflective material, such as a metal. Any suitable reflective metal, such as nickel, aluminum, tantalum, tungsten, and copper, can be used as the mask 66. In certain embodiments, the thickness of the mask 66 ranges from about 20 nm to about 200 nm. The mask 66 is formed by CVD, ALD, electroplating, or other suitable methods.

Figure 21:
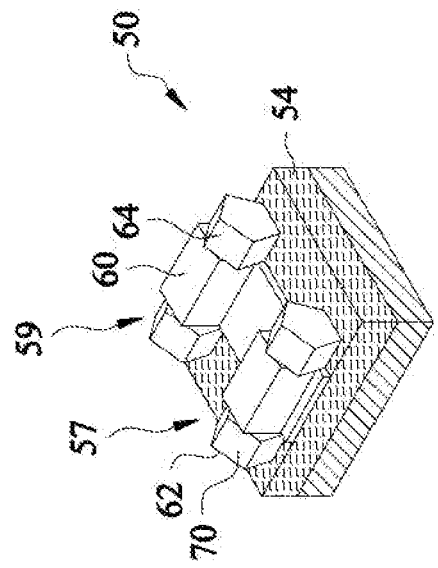
FIG. 21 is an isometric view of an exemplary sequential operation in a method of manufacturing a CMOS FinFET device according to an embodiment of the present disclosure.
Figure 22:
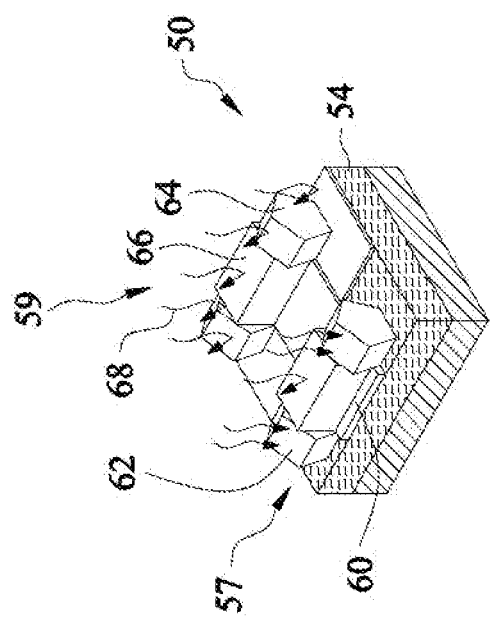
FIG. 22 is an isometric view of an exemplary sequential operation in a method of manufacturing a CMOS FinFET device according to an embodiment of the present disclosure.

The CMOS device 50 is subsequently exposed to radiation 68, such as laser radiation, as shown in FIG. 21. The radiation is absorbed by the source/drain regions 62 of the nFET 57, and is reflected by the gate structure 60 of the nFET 57 and mask 66 over the pFET 59, thereby transforming a surface portion of the source/drain regions 62 of the nFET to a surface portion 70 having a higher concentration of a second element of the alloy material than an interior portion of the source/drain regions 62, as shown in FIG. 22.

In a certain embodiment, the n-type fin structure 56 is made of $Ge_{1-y}Sn_y$, and the p-type fin structure 58 is made of $Ge_{1-p}Sn_p$. The epitaxially formed source/drain regions 62, 64 are made of $Ge_{1-z}Sn_z$, where z>p. After exposure to radiation 68, the pFET source/drain region 64 is maintained as $Ge_{1-z}Sn_z$ because the pFET was protected by the reflective mask 66 during radiation exposure 68. The nFET source/drain region 62 has a surface portion 70, having an Sn-rich composition $Ge_{1-z}Sn_w$, where w>y; and an Sn-poor interior portion having a composition $Ge_{1-x}Sn_x$, where x<y. The Sn-poor interior portion interior portion of the nFET source/drain region 62 induces tensile strain in the channel region, thereby improving electron mobility in the channel region of n-type FETs.

Figure 23:
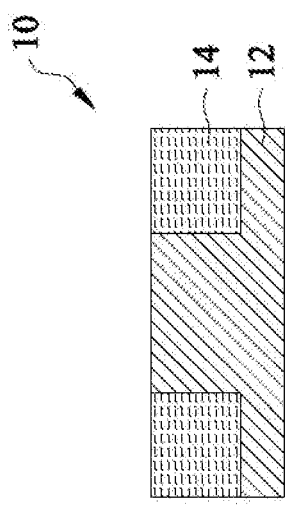
FIG. 23 is a cross-sectional view of an exemplary sequential operation in a method of manufacturing a semiconductor device according to an embodiment of the present disclo

FIGS. 23 to 30 are cross-sectional views of exemplary sequential operations in a method of manufacturing a semiconductor device 10 according to another embodiment of the present disclosure. Isolation insulating layers 14, such as shallow trench isolation regions, are formed in a semiconductor substrate 12, as shown in FIG. 23.

Figure 24:
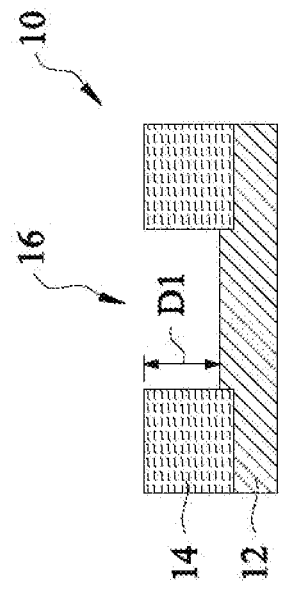
- FIG. 24 is a cross-sectional view of an exemplary sequential operation in a method of manufacturing a semiconductor device according to an embodiment of the present disclosure.

A portion of the semiconductor substrate 12 is removed between adjacent isolation insulating layers 14 to form a recess 16, as shown in FIG. 24. In some embodiments, the portion of the semiconductor substrate removed is removed by suitable photolithographic and etching operations. The depth D1 of the recess from an upper surface of the isolation insulation layer 14 to the upper surface of the substrate 12 is about 1 to about 200 nm in some embodiments.

Figure 25:
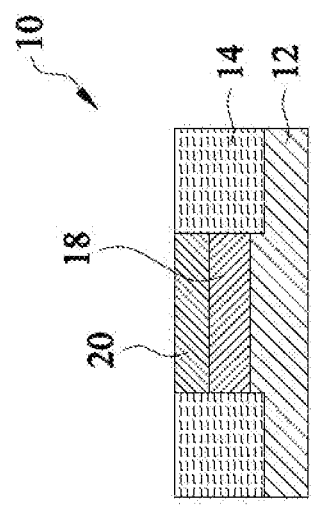
FIG. 25 is a cross-sectional view of an exemplary sequential operation in a method of manufacturing a semiconductor device according to an embodiment of the present disclosure.

A first semiconductor layer 18 is formed in the recess 16 and a second semiconductor layer 20 is formed over the first semiconductor layer 18, as shown in FIG. 25. In some embodiments, a planarization operation is performed on the device, so that the upper surface of the isolation insulating layer 14 is at the same level as the upper surface of the second semiconductor layer 20. The first and second semiconductor layers 18, 20 are the same materials and are formed in the same manner as the first and second semiconductor layers 18, 20 in the embodiments described herein in reference to FIG. 3.

Figure 26:
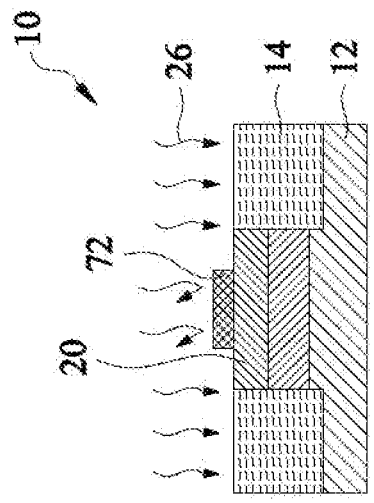
FIG. 26 is a cross-sectional view of an exemplary sequential operation in a method of manufacturing a semiconductor device according to an embodiment of the present disclosure.

A reflective mask 72 is subsequently formed over the second semiconductor layer 20, as shown in FIG. 26, and the semiconductor device is exposed to radiation 26, such as laser radiation. Any suitable reflective metal, such as nickel, aluminum, tantalum, tungsten, and copper, can be used as the mask 72. In certain embodiments, the thickness of the mask 72 ranges from about 20 nm to about 200 nm. The mask 72 is formed by CVD, ALD, electroplating, or other suitable methods. The reflective mask 72 reflects the radiation 26, while the radiation is absorbed by the regions of the semiconductor device 10 not covered by the reflective mask 72. The second semiconductor layer 20 is annealed by the absorbed radiation 26.

In some embodiments, metal gate electrode and/or metal mask, in addition to blocking (reflecting) the radiation, also protects the gate dielectric, pFET, and/or channel region during the annealing.

Figure 27:
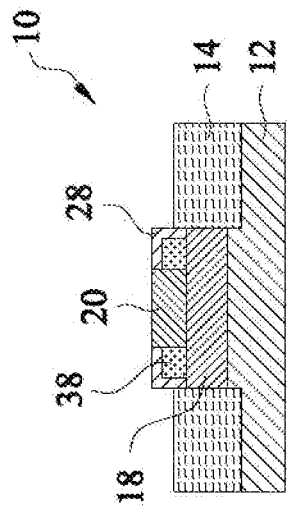
FIG. 27 is a cross-sectional view of an exemplary sequential operation in a method of manufacturing a semiconductor device according to an embodiment of the present disclosure.

The mask 72 is removed to expose the upper surface of the second semiconductor layer after the irradiation operation, as shown in FIG. 27. As described herein, the annealing operation transforms the second semiconductor layer so that a surface portion 28 of the second semiconductor layer includes a layer or islands having a higher concentration of a second element of the alloy material of the second semiconductor layer than an interior portion of the second semiconductor layer 38.

Figure 28:
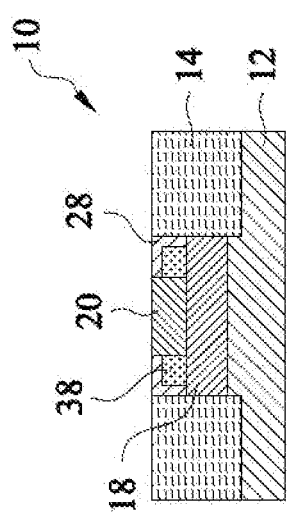
FIG. 28 is a cross-sectional view of an exemplary sequential operation in a method of manufacturing a semiconductor device according to an embodiment of the present disclosure.

The isolation insulating layers 14 are subsequently recess etched in some embodiments exposing at least a portion of the side surface of the surface portion 28 of the second semiconductor layer, as shown in FIG. 28.

Figure 29:
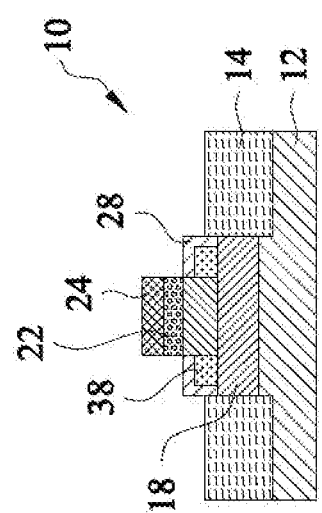
FIG. 29 is a cross-sectional view of an exemplary sequential operation in a method of manufacturing a semiconductor device according to an embodiment of the present disclosure.

A gate electrode structure including, a gate dielectric layer 22 and a gate electrode layer 24, is subsequently formed on the channel region of the second semiconductor layer 20, as shown in FIG. 29. The gate dielectric layer 22 and the gate electrode layer 24 are formed of the same material and in the same manner described herein with respect to the embodiment of FIG. 4.

Figure 30:
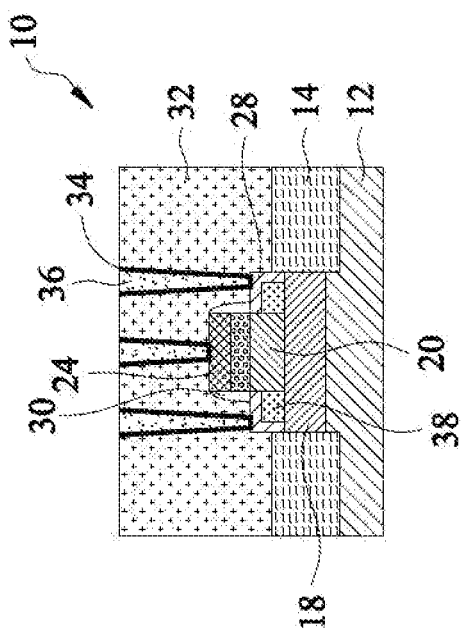
FIG. 30 is a cross-sectional view of an exemplary sequential operation in a method of manufacturing a semiconductor device according to an embodiment of the present disclosure.

Adverting to FIG. 30, in some embodiments of the disclosure, insulating sidewalls 30 are formed on lateral surfaces of the gate electrode structure, and an interlayer dielectric 32 is formed overlying the semiconductor device 10. In some embodiments, a contact barrier liner layer 34 is formed in the via prior to forming the contact 36. The insulating sidewalls 30, interlayer dielectric 32, contacts 36, and contact barrier liner layers 34 are formed of the same material and in the same manner as described herein with respect to the embodiment of FIG. 7.

Figure 31:
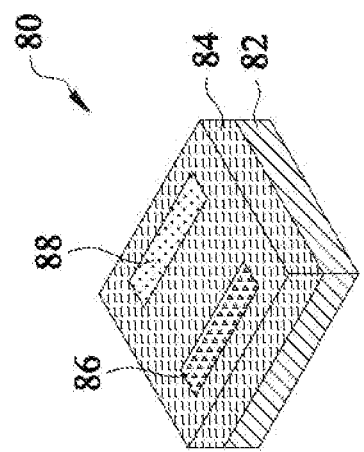
FIG. 31 is an isometric view of an exemplary sequential operation in a method of manufacturing a CMOS FinFET device according to an embodiment of the present disclosure.

FIGS. 31-35 are isometric views of exemplary sequential operations in a method of manufacturing a complementary metal oxide semiconductor (CMOS) device 80 according to another embodiment of the present disclosure. As shown in FIG. 31, an n-type fin structure 86 and p-type fin structure 88 are formed on a semiconductor substrate 82. An isolation insulating layer 84 is formed on the semiconductor substrate 82 surrounding the fin structures 86, 88. In some embodiments, the device is planarized, such as by CMP, so that the upper surfaces of the fin structures 86, 88 and the upper surface of the isolation insulating layer 84 are substantially coplanar.

Figure 32:
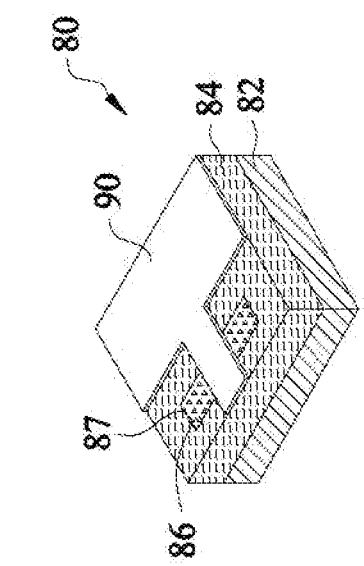
FIG. 32 is an isometric view of an exemplary sequential operation in a method of manufacturing a CMOS FinFET device according to an embodiment of the present disclosure.

A mask 90 is subsequently formed over the p-type fin structure 88 and a channel region n-type fin structure 86, as shown in FIG. 32. The mask is a reflective material, such as a metal. Any suitable reflective metal, such as nickel, aluminum, tantalum, tungsten, and copper, can be used as the mask 90. In certain embodiments, the thickness of the mask 90 ranges from about 20 nm to about 200 nm. The mask 90 is formed by CVD, ALD, electroplating, or other suitable methods.

Figure 33:
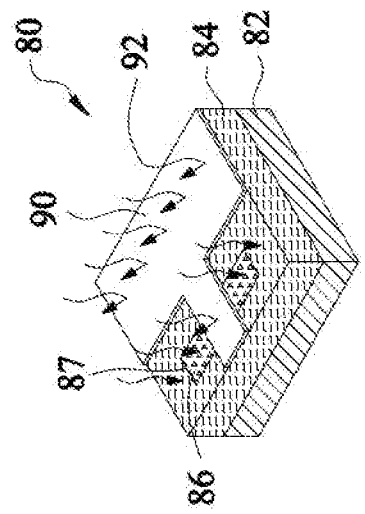
FIG. 33 is an isometric view of an exemplary sequential operation in a method of manufacturing a CMOS FinFET device according to an embodiment of the present disclosure.
Figure 34:
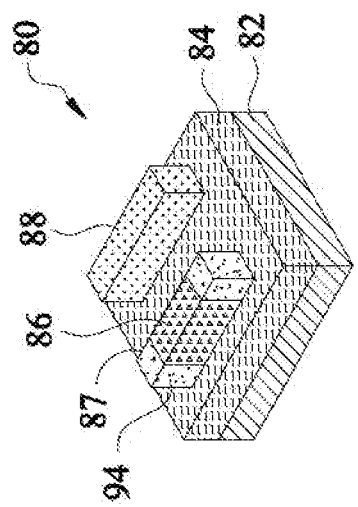
FIG. 34 is an isometric view of an exemplary sequential operation in a method of manufacturing a CMOS FinFET device according to an embodiment of the present disclosure.

The CMOS device 80 is subsequently exposed to radiation 92, such as laser radiation, as shown in FIG. 33. The radiation is absorbed by the exposed source/drain regions 87 of the n-type fin structure 86, and is reflected by the reflective mask 90, thereby transforming a surface portion of the source/drain regions 87 of the nFET to a surface portion 94 having a higher concentration of a second element of the alloy material than an interior portion of the source/drain regions 87, as shown in FIG. 34. FIG. 34 shows the structure of the CMOS device 80 after the isolation insulating layer 84 is recessed. The isolation insulating layer 84 is recessed by an etch back operation in some embodiments.

Figure 35:
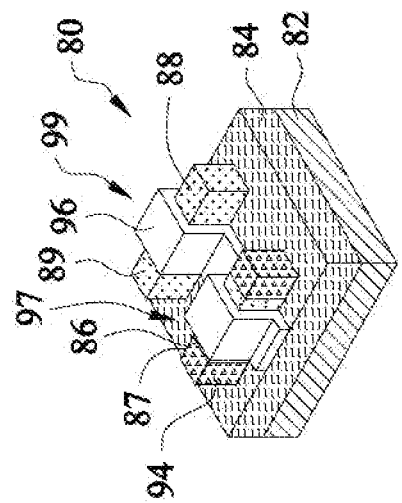
FIG. 35 is an isometric view of an exemplary sequential operation in a method of manufacturing a CMOS FinFET device according to an embodiment of the present disclosure.

A gate stack 96, including a gate dielectric layer and gate electrode layer, is formed overlying a channel region of the fin structures 86, 88. Source/drain regions 87, 89 are formed on the fin structures 86, 88 on opposing sides of the gate structure 96, in some embodiments, forming an n-type FET (nFET) 97 and a p-type FET (pFET) 99, as shown in FIG. 35.

Figure 37:
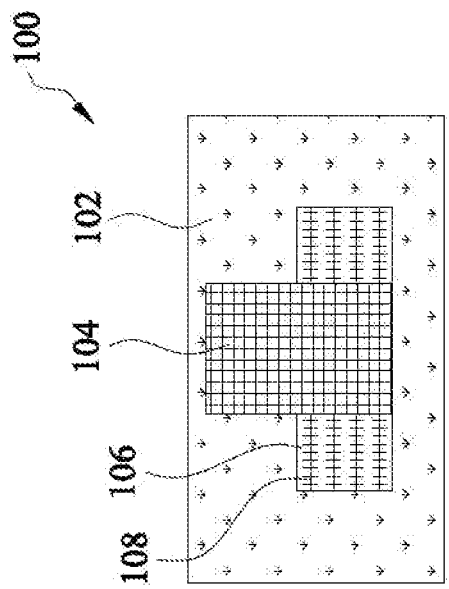
FIG. 37 is a plan view of an exemplary semiconductor device according to an embodiment of the present disclosure.
Figure 36:
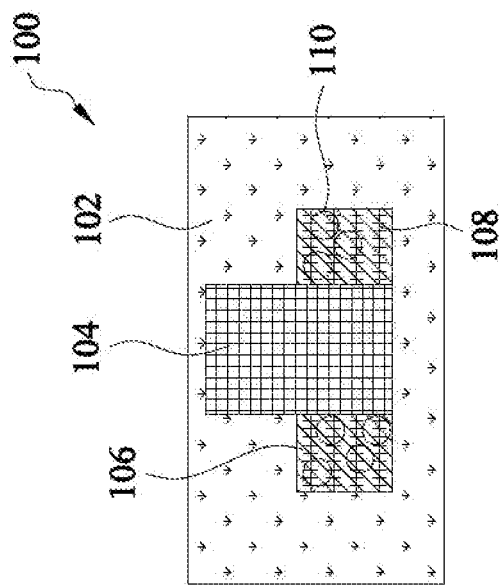
FIG. 36 is a plan view of an exemplary semiconductor device according to an embodiment of the present disclosure.

In some embodiments, the radiation annealing causes the second alloy element of the semiconductor alloy to migrate to the surface of the semiconductor alloy and form islands of higher concentration second alloy element on the surface of the second semiconductor alloy. As shown in a plan view of a gate structure/fin structure detail of a semiconductor device 100 (FIG. 36) according to some embodiments, a gate electrode 104 has source/drain regions 106 formed on opposing sides of the gate electrode 104. An isolation insulating region 102 surrounds the gate electrode 104 and source/drain regions 106. Laser annealing in some embodiments forms islands 110 of higher concentration of the second alloy element of the semiconductor alloy on the surface of the source/drain regions 106. Laser annealing also forms a stripe-like rough surface on the surface of the source/drain regions 106, as illustrated by stripes 108 on the source/drain regions 106. The scanning laser beam may produce the stripe-like or rough surface because not every point on the surface may receive the same amount of laser radiation. In other embodiments, the surface of the source/drain regions 106 is covered with a more evenly distributed surface layer of increased concentration of the second alloy element of the source/drain semiconductor alloy, as shown in FIG. 37.

Figure 39:
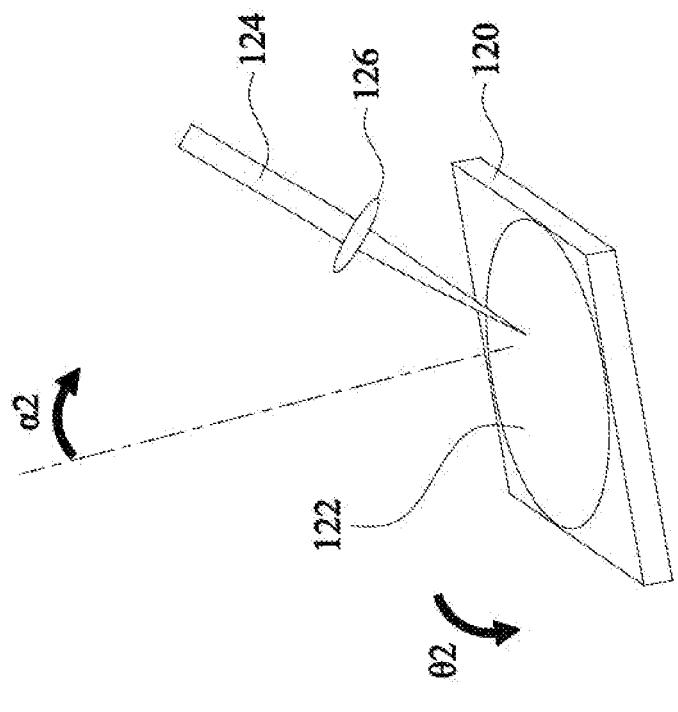
FIG. 39 is a view of an exemplary operation in a method of manufacturing a semiconductor device according to an embodiment of the present disclosure.
Figure 38:
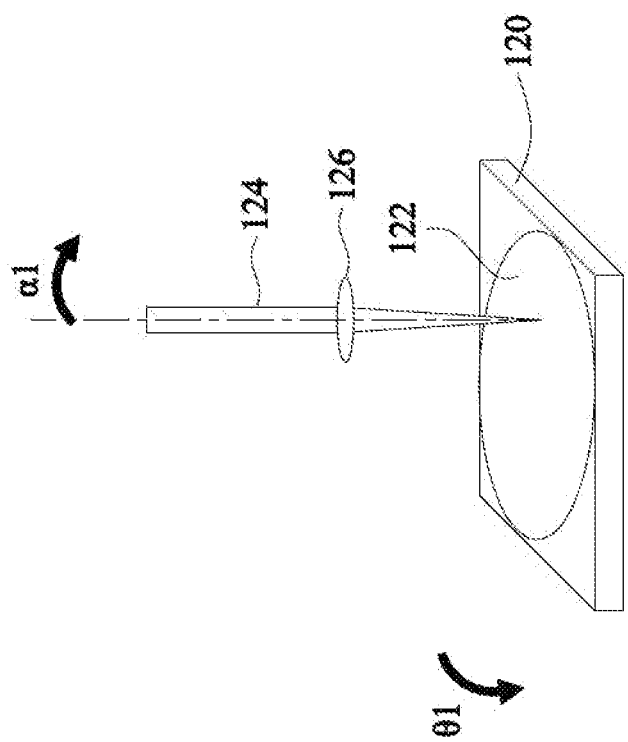
FIG. 38 is a view of an exemplary operation in a method of manufacturing a semiconductor device according to an embodiment of the present disclosure.

FIGS. 38 and 39 illustrate the relationship between a wafer and a laser beam (incident angle). As shown in FIGS. 38 and 39, the angle of incidence $\alpha 1$, $\alpha 2$ of the laser beam irradiating the semiconductor device varies in different embodiments. As shown in FIG. 38, the angle of incidence $\alpha 1$ in some embodiments is about 90°. The semiconductor devices are formed on a wafer 122 in some embodiments. The wafer 122 is located on a stage 120 in this embodiment. In certain embodiments, the stage and radiation source are configured to tilt independently of each other, and the stage or the radiation source is tilted so that an angle of incidence of radiation from the radiation source $\theta 1$ from a horizontal orientation onto the surface region of the unmasked portion of the alloy semiconductor material layer is less than 90°. In certain embodiments, the stage 120 is tilted at an angle $\theta 1$ of about 0°, and the laser beam 124 is focused by a lens 126. In other embodiments, the stage 120 is tilted at an angle of $\theta 2$ from a horizontal orientation, and the laser beam is tilted at an angle of incidence $\alpha 2$. In certain embodiments, the stage is tilted at an angle of $0° \leq \theta 2 \leq 60°$. In certain embodiments, the angle of incidence of the laser beam is $0° \leq \alpha 2 \leq 60°$. The laser beam and the stage may be tilted in order to vary the amount of incident laser radiation that is absorbed or reflected by the semiconductor layers. For example, for a Ge layer on a Si layer, where the indices of refraction are $n_{Ge}=4.999$ and $n_{Si}=4.142$, being irradiated by a 532 nm wavelength laser, total reflection happens when the laser beam is tilted 56°. In order to avoid undesirable total reflection, the angle of incidence of the laser beam is $0° \leq \alpha 2 \leq 60°$ in order to avoid total reflection ($\alpha 2$ needs to be lower than 56° in the case of Ge being irradiated by a 532 nm wavelength laser on Si). When total reflection happens, the laser beam will propagate in the Ge layer on Si like a waveguide. In the case of total internal reflection, the region being annealed cannot be controlled. So total reflection is undesirable.

In an exemplary embodiment, an nFET stressor region is formed in a semiconductor layer by subjecting a GeSn layer to laser annealing using a laser with a wavelength of 532 nm, power density of 25 mJ/cm$^2$, repetition rate of 50 kHz, FWHM of 12 ns, elliptical-shaped beam, with a velocity of wafer stage carrying the wafers of 6 cm/s and scanning velocity of the laser beam of 0 cm/s. The exemplary nFET contains a buffer layer, a nFET S/D stressor comprising $Ge_{1-x}Sn_x$ wherein $0 \leq x < 0.35$, $Ge_{1-y}Sn_y$ channel wherein $x < y < 0.35$, and a Sn-rich $Ge_{1-w}Sn_w$ island/layer on the nFET S/D stressor $Ge_{1-x}Sn_x$, where $x < y < w$.

In an exemplary embodiment, after laser annealing an alloy semiconductor layer having a composition of $Ge_{0.83}Sn_{0.17}$, a surface layer having Sn-rich islands is provided having a composition of $Ge_{0.66}Sn_{0.34}$, and the Sn-reduced interior stressor portion has a composition of $Ge_{0.92}Sn_{0.08}$.

Embodiments of the disclosure provide the advantage of using a single step process, such as laser annealing, to activate dopants, form an S/D stressor, and form a Sn-rich island/layer on the surface of the S/D regions. The Sn-rich island/layer on the S/D regions provide reduced contact resistance.

In an embodiment of the disclosure, a method of manufacturing a semiconductor device includes forming an alloy semiconductor material layer comprising a first element and a second element on a semiconductor substrate. A mask is formed on the alloy semiconductor material layer to provide a masked portion and an unmasked portion of the alloy semiconductor material layer. The unmasked portion of the alloy semiconductor material layer not covered by the mask is irradiated with radiation from a radiation source to transform the alloy semiconductor material layer so that a surface region of the unmasked portion of the alloy semiconductor material layer has a higher concentration of the second element than an internal region of the unmasked portion of the alloy semiconductor material layer. The surface region surrounds the internal region. In another embodiment of the disclosure, a method of manufacturing a semiconductor device includes forming a plurality of isolation insulating layers in a semiconductor substrate, and removing a portion of the semiconductor substrate between adjacent spaced apart isolation insulating layers to form a recess. A first semiconductor material layer is formed in the recess. A second semiconductor material layer is formed on the first semiconductor material layer. The second semiconductor material is different from the first semiconductor material. The second semiconductor material is an alloy comprising a first element and a second element different from the first element. The insulating layers are etched to recess the insulating layers below an upper surface of the second semiconductor material layer. A mask is formed on the second semiconductor material layer to provide a masked portion and an unmasked portion of the second semiconductor material layer. The unmasked portion of the second semiconductor material layer not covered by the mask is irradiated with radiation from a radiation source to transform the second semiconductor material layer so that a surface region of the unmasked portion of the second semiconductor material layer has a higher concentration of the second element than an internal region of the second semiconductor material layer. The surface region surrounds the internal region.

In another embodiment of the disclosure, a semiconductor device is provided including a first semiconductor material layer disposed on a semiconductor substrate. A second semiconductor material layer is disposed on the first semiconductor material layer. The second semiconductor material is formed of an alloy comprising a first element and a second element, and the first semiconductor material and the second semiconductor material are different. A gate electrode structure is disposed on a first portion of the second semiconductor material layer. A surface region of a portion of the second semiconductor material layer not covered by the gate electrode structure has a higher concentration of the second element than an internal region of the portion of the second semiconductor material layer not covered by the gate electrode structure.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a first layer of a first semiconductor material disposed on a semiconductor substrate; and
   a second layer of a second semiconductor material disposed on the first layer, the second semiconductor material being an alloy containing Sn, the second layer comprising:
      a surface region in an end portion of the second layer at both ends of the second layer,
      an internal region in the end portion and surrounded by the surface region, wherein the surface region covers a top surface of the internal region and a side surface of the internal region, and
      a channel region in a middle portion of the second layer and between the both ends,
   wherein a concentration of Sn in the channel region is higher than a concentration of Sn in the internal region and less than a concentration of Sn in the surface region.

2. The semiconductor device of claim 1, further comprising source and drain contacts disposed over the surface region of the end portion of the second layer at opposite ends thereof.

3. The semiconductor device of claim 1, further comprising a gate structure disposed over the channel region of the second layer.

4. The semiconductor device of claim 3, wherein the gate structure comprises a gate dielectric layer and a gate electrode layer.

5. The semiconductor device of claim 1, further comprising two isolation insulating layers disposed at least partially in the semiconductor substrate.

6. The semiconductor device of claim 5, wherein the first layer and at least a part of the second layer are disposed in a recess formed between the two isolation insulating layers.

7. The semiconductor device of claim 1, wherein the channel region comprises a tensile strained channel region.

8. The semiconductor device of claim 1, wherein the first semiconductor material is selected from the group consisting of Si, Ge, and SiGe.

9. A semiconductor device comprising:
   two isolation insulating layers disposed at least partially in a semiconductor substrate;
   a buffer layer disposed over the semiconductor substrate; and
   an alloy semiconductor material layer comprising Sn and disposed over the buffer layer and at least partially in a recess between the two isolation insulating layers, and comprising:
      a surface region in an end portion of the alloy semiconductor material layer at both ends thereof,
      an internal region in the end portion and surrounded by the surface region, wherein the surface region covers a top surface of the internal region and a side surface of the internal region, and
      a channel region in a middle portion of the alloy semiconductor material layer and between the both ends,
   wherein a concentration of Sn in the channel region is higher than a concentration of Sn in the internal region and less than a concentration of Sn in the surface region.

10. The semiconductor device of claim 9, further comprising:
    source and drain contacts disposed over the surface region of the end portion of the alloy semiconductor material layer at the both ends of the alloy semiconductor material layer.

11. The semiconductor device of claim 9, further comprising:
    a gate structure disposed over the channel region of the alloy semiconductor material layer between the both ends of the alloy semiconductor material layer.

12. The semiconductor device of claim 11, wherein the gate structure comprises a gate dielectric layer and a reflective gate electrode layer that is reflective in a wavelength range between 193 nm and 2296 nm.

13. The semiconductor device of claim 9, wherein the semiconductor substrate comprises a material selected from the group consisting of Si, Ge, and SiGe, and wherein the material of the semiconductor substrate is different from a material of the buffer layer.

14. The semiconductor device of claim 9, wherein the buffer layer comprises a material selected from the group consisting of Si, Ge, and SiGe.

15. The semiconductor device of claim 14, wherein the material of the buffer layer is germanium.

16. A semiconductor device, comprising:
    a first layer comprising Ge disposed in a recess between two isolation insulating layers that are at least partially in a semiconductor substrate; and
    a second layer of a second semiconductor material disposed over the first layer, and comprising:
       a surface region in an end portion of the second layer at both ends thereof,
       an internal region in the end portion and surrounded by the surface region, wherein the surface region covers a top surface of the internal region and a side surface of the internal region, and
       a channel region in a middle portion of the second layer and between the both ends,
    wherein the second semiconductor material is an alloy comprising Ge and Sn, and wherein a concentration of Sn in the channel region is higher than a concentration of Sn in the internal region and less than a concentration of Sn in the surface region.

17. The semiconductor device of claim 16, wherein an upper surface of each of the two isolation insulating layers is below an upper surface of the second layer.

18. The semiconductor device of claim 16, further comprising:
   source and drain contacts disposed over the surface region of the end portion at opposite ends of the second layer.

19. The semiconductor device of claim 16, further comprising:
   a gate structure disposed over the channel region of the second layer.

20. The semiconductor device of claim 19, wherein the gate structure comprises a gate dielectric layer and a reflective gate electrode layer that is reflective in a wavelength range between 193 nm and 2296 nm.

* * * * *